United States Patent
Suzuki et al.

(10) Patent No.: US 6,639,458 B2
(45) Date of Patent: Oct. 28, 2003

(54) FM DEMODULATOR CAPABLE OF PROVIDING DEMODULATED DATA WITH HIGH DETERMINATION ACCURACY

(75) Inventors: Takeo Suzuki, Fukushima-ken (JP); Akihisa Iikura, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/126,386

(22) Filed: Apr. 19, 2002

(65) Prior Publication Data

US 2002/0153945 A1 Oct. 24, 2002

(30) Foreign Application Priority Data

Apr. 24, 2001 (JP) ........................................ 2001-126007

(51) Int. Cl.[7] ................................................ H03D 3/00
(52) U.S. Cl. ...................................... 329/315; 329/303
(58) Field of Search ................................ 329/315, 318, 329/319, 320, 321, 300, 303, 341, 343; 375/340, 324, 334–337

(56) References Cited

U.S. PATENT DOCUMENTS 3,571,712 A * 3/1971 Hellwarth et al. .......... 375/328
5,436,589 A * 7/1995 La Rosa et al. ............ 329/302
5,652,541 A * 7/1997 Yang et al. ................. 329/300
2002/0044013 A1 * 4/2002 Yoshida ..................... 329/300

FOREIGN PATENT DOCUMENTS

JP      H11-317626      11/1999

* cited by examiner

*Primary Examiner*—Robert Pascal
*Assistant Examiner*—Joseph Chang
(74) *Attorney, Agent, or Firm*—Brinks Hofer Gilson & Lione

(57) ABSTRACT

An FM demodulator for reproducing data by performing FM demodulation of a received RF signal in a Bluetooth transmission system is provided. The FM demodulator includes a frequency discrimination unit and a level determination unit. The FM demodulator frequency-discriminates the RF signal, performs digital conversion of the discriminated RF signal, and outputs converted data. The level determination unit performs level comparison of current input-data, supplied from the frequency discrimination unit in the latest clock period, with last input-data, supplied from the frequency discrimination unit in the immediately preceding clock period, determines a logic state of the current input-data based on the result of the level comparison, and reproduces data in accordance with the determined logic state.

3 Claims, 2 Drawing Sheets

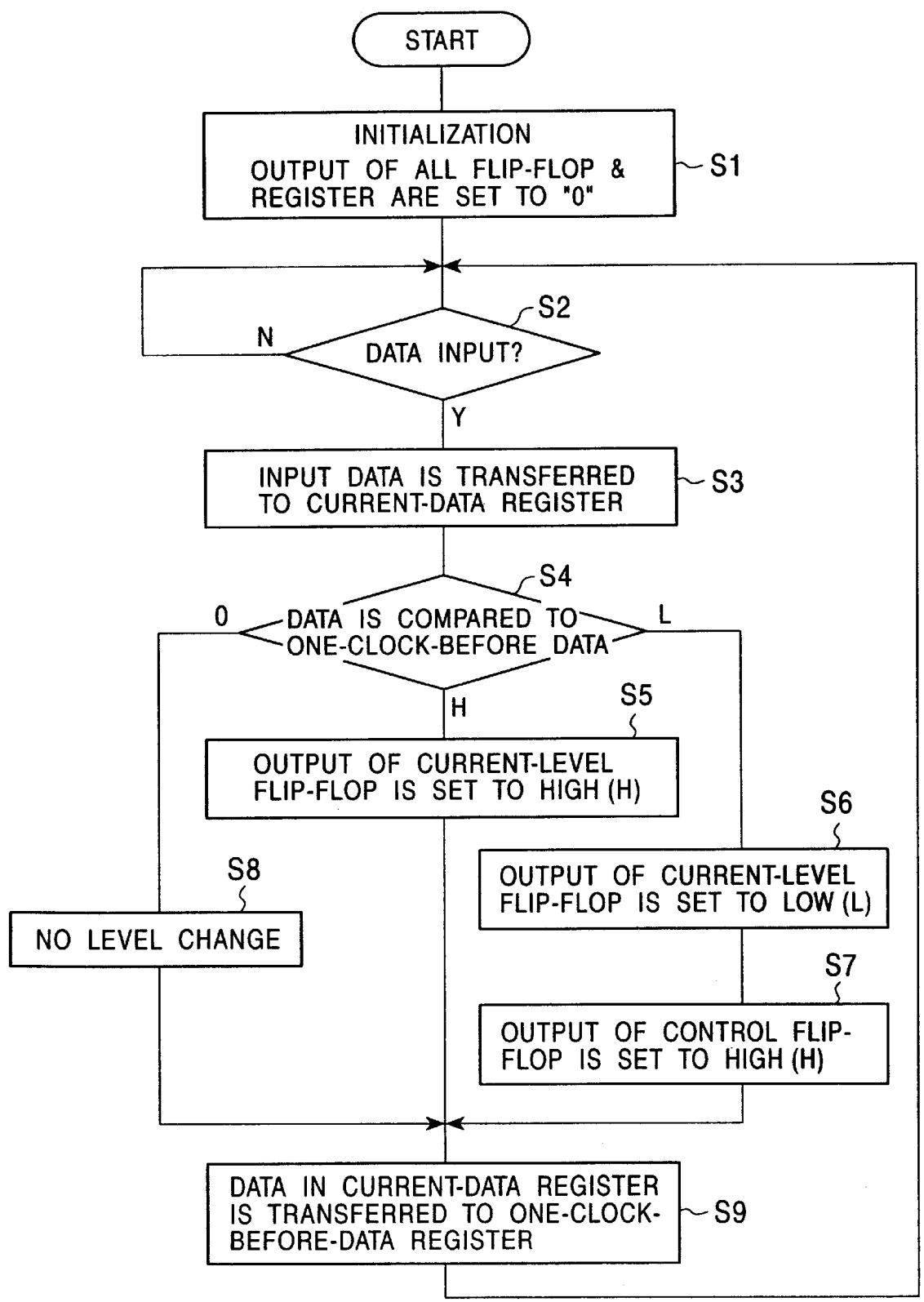

FM DEMODULATOR CAPABLE OF PROVIDING DEMODULATED DATA WITH HIGH DETERMINATION ACCURACY

BACKGROUND OF THE INVENTION

1. Field of the Invention

This invention generally relates to FM (frequency modulation) demodulators. More particularly, the present invention relates to an FM demodulator which determines the logic state of current input-data by performing level comparison of the current input-data and the preceding input-data and which reproduces data in accordance with the determination, thereby performing FM demodulation of a received Bluetooth radio signal.

2. Description of the Related Art

Typically, many radio signal receivers that reproduce FM signals incorporate FM demodulators of the type that perform FM demodulation of received signals by utilizing a resonating circuit having an S-shaped characteristic curve. In such an FM demodulator, when a received signal is supplied to the resonating circuit having the S-shaped characteristic curve, the resonating circuit outputs an FM demodulated signal whose level is shifted from a reference level toward a positive- or negative-level in accordance with the direction and amount of frequency displacement from the FM signal carrier frequency. When the FM demodulated signal contains binary data, the positive- or negative-level FM demodulated signal output from the resonating circuit is supplied to a level determination unit. At this point, the level determination unit performs level comparison of the positive- or negative-level FM demodulated signal with the average integrated level of previous FM demodulated signals. When the level comparison result indicates that the level of the current FM demodulated signal is greater than the average integrated level of the previous FM demodulated signals, the level determination unit generates a demodulated output indicating a high (H) level as data. On the other hand, when the current demodulated signal level, is smaller than the average integrated level of the previous FM demodulated signals, the level determination unit generates a demodulated output indicating a low (L) level as data.

Recently, as a new method for transmitting radio signals between apparatuses such as portable telephones and personal computers without the need for wire connections, a radio-signal transmission system employing Bluetooth technology has been brought to attention. The Bluetooth radio-signal transmission system employs the 2.4-GHz band, which has been set aside, for its frequency band. While the effective distance of transmitted radio signals is limited to quite a short distance of about 10 meters, the Bluetooth system is robust and simple and also has the feature of being able to transfer data with low power consumption and at low cost.

In this case, the Bluetooth radio-signal transmission system employs an FM system as the method for modulating information signals. Since the effective transmission distance is about 10 meters, which is short, the system is effectively used to wirelessly link apparatuses in a single room in an office or the like. Possible applications include a connection between the main part of a personal computer and a peripheral device such as a mouse or keyboard, a connection between a portable telephone and a notebook computer, and a connection between a stereo set and headphones. Other potential applications include a connection between a portable telephone and a vending machine, and a connection between a portable telephone and a parking meter in a parking lot, provided that they are located in close proximity to each other.

Since the Bluetooth radio-signal transmission system was developed on the premise that the system is incorporated in existing apparatuses in order to allow the apparatuses to communicate with each other, the configuration of the system must be low cost. As a result, in the specification of the Bluetooth radio-signal transmission system, the frequency tolerance with respect to the carrier wave or modulation wave is relatively large. Thus, when the FM demodulator of a receiver is configured with a resonating circuit having an S-shaped characteristic curve as described above, since the specification is relatively loose, the FM demodulator cannot form a demodulated signal (demodulated data) with high determination accuracy. For example, when an FM signal is supplied to the resonating circuit to provide a positive- or negative-level demodulated output, level comparison of the demodulated output level and the absolute level is performed in a level determination unit, and based on the level comparison, level determination is made as to whether the output data is at the high (H) level or the low (L) level, there is difference in some cases between the determined level and the level of the current data.

In order to address such a problem, the Bluetooth radio-signal transmission system is designed to be able to determine whether the demodulated data is at the high (H) or low (L) level by identifying the relative levels of the demodulated data and data adjacent to the demodulated data. With respect to data transmitted in the radio signal, the numbers of the high (H) levels and low (L) levels are adapted to become generally uniform by Gaussian Frequency Shift Keying (GFSK).

SUMMARY OF THE INVENTION

The present invention has been made in view of the foregoing technical background, and an object thereof is to provide an FM demodulator which can determine whether the demodulated data is at the high (H) or low (L) level with a simplified configuration and which can provide demodulated data with high determination accuracy.

To achieve the object, there is provided an FM demodulator for reproducing data by performing FM demodulation of a received RE signal in a Bluetooth transmission system. The FM demodulator includes a frequency discrimination unit and a level determination unit. The FM demodulator frequency-discriminates the RF signal, performs digital conversion of the discriminated RF signal, and outputs converted data. The level determination unit performs level comparison of current input-data, supplied from the frequency discrimination unit in the latest clock period, with last input-data, supplied from the frequency discrimination unit in the immediately preceding clock period, determines a logic state of the current input-data based on the result of the level comparison, and reproduces data in accordance with the determined logic state.

According to the present invention, the current input-data supplied from the frequency discrimination unit for each new clock period is compared with the last input-data supplied from the frequency discrimination unit in the immediately preceding clock period to determine the relative level of the current input-data with respect to the last input-data. The logic state of the current input-data is determined based on the determination result, thereby providing an advantage that demodulated binary data can be reproduced with high determination accuracy.

Preferably, the level comparison of the current input-data with the last input-data is performed by a current-data register for retaining the current input-data, a one-clock-before-data register for retaining the last input-data, and a comparator for comparing the output states of the two registers.

With this arrangement, the level comparison of the current input-data and the last input-data uses only two registers and one comparator, thereby providing an advantage that the level comparison can be performed with a simplified configuration.

Preferably, the determination of the logic state of the current input-data is performed by a current-level flip-flop and an output-control flip-flop which have different output states in response to the result of the level comparison of the current input-data and the last input-data, and by a controllable amplifier having an output logic value that is controlled in accordance with the output states of the two flip-flops.

With this arrangement, the determination of the logic state of the current input-data uses only two flip-flops and one controllable amplifier, thereby providing an advantage that the logic state can be determined with a simple configuration.

BRIEF DESCRIPTION OF THE DRAWINGS

FIG. 2 is a flow chart showing the major operation processes executed in the level determination unit of the FM demodulator shown in FIG. 1.

DESCRIPTION OF THE PREFERRED EMBODIMENT

Figure 1:
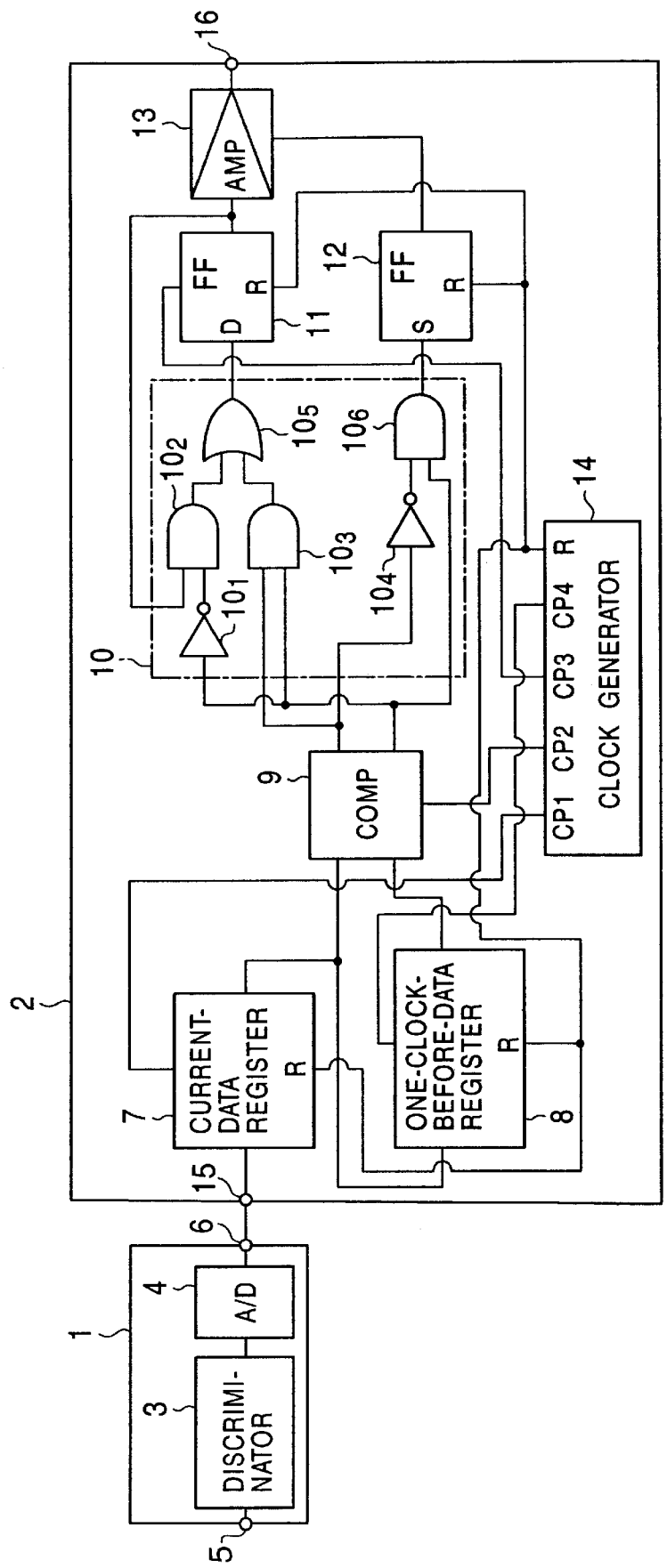
FIG. 1 is a block diagram showing the configuration of the major portion of an FM demodulator according to an embodiment of the present invention.

An embodiment of the present invention will be described below with reference to the accompanying drawings.

FIG. 1 is a block diagram showing the major portion of an FM modulator circuit according to an embodiment of the present invention.

As shown in FIG. 1, the FM modulator circuit according to the embodiment is made up of a frequency discrimination unit 1 and a level determination unit 2. In this embodiment, the frequency discrimination unit 1 includes a discriminator (a resonating circuit) 3 having an S-shaped characteristic curve and an analog-to-digital (A/D) converter 4, a signal input terminal 5, and a signal output terminal 6. The level determination unit 2 includes a current-data register 7, a one-clock-before-data register 8, a comparator (COMP) 9, a logic circuit 10, a current-level flip-flop 11, a control flip-flop 12, a control amplifier (AMP) 13, a clock generator 14, a signal input terminal 15, and a data output terminal 16. The logic circuit 10 includes a first inverter $10_1$, a first AND gate $10_2$, a second AND gate $10_3$, a second inverter $10_4$, an OR gate $10_5$, and a third AND gate $10_6$.

In the frequency discrimination unit 1, the input port of the discriminator 3 is coupled to the signal input terminal 5 and the output port thereof is coupled to the input port of the analog-to-digital converter 4. The output port of the analog-to-digital converter 4 is coupled to the signal output terminal 6. The signal output terminal 6 is coupled to the signal input terminal 15 of the level determination unit 2 at the subsequent stage.

In the level determination unit 2, the current-data register 7 has an input port coupled to the signal input terminal 15 and an output port coupled to a first input port of the one-clock-before-data register 8. The current-data register 7 also has a clock input port coupled to a clock output port CP1 of the clock generator 14 and a reset port coupled to a reset pulse output port R of the clock generator 14. The one-clock-before-data register 8 also has an output port coupled to a second input port of the comparator 9, a clock input port coupled to a clock output port CP4 of the clock generator 14, and a reset port coupled to the reset pulse output port R of the clock generator 14. The comparator 9 also has a determination output port O1, a significant-difference output port O2, and a clock input port. The determination output port O1 is coupled to a first input port of the second AND gate $10_3$ and the input port of the second inverter $10_4$. The significant-difference output port O2 is coupled to the input port of the first inverter $10_1$, a second input port of the second AND gate $10_3$, and a second input port of the third AND gate $10_6$. The clock input port of the comparator 9 is coupled to a clock output port CP2 of the clock generator 14.

In the logic circuit 10, the output port of the first inverter $10_1$ is coupled to a second input port of the first AND gate $10_2$. A first input port of the first AND gate $10_2$ is coupled to the output port of the current-level flip-flop 11, and the output port of the first AND gate $10_2$ is coupled to a first input port of the OR gate $10_5$. The output port of the second AND gate $10_3$ is coupled to a second input port of the OR gate $10_5$. The output port of the second inverter $10_4$ is coupled to a first input port of the third AND gate $10_6$. The output port of the OR gate $10_5$ is coupled to a data input port D of the current-level flip-flop 11. The output port of the third AND gate $10_6$ is coupled to a control port S of the control flip-flop 12.

The current-level flip-flop 11 also has an output port coupled to the input port of the control amplifier 13, a clock input port coupled to an output port CP3 of the clock generator 14, and a reset port coupled to the reset pulse output port R of the clock generator 14. The control flip-flop 12 has an output port coupled to a control port of the control amplifier 13 and a reset port coupled to the reset pulse output port R of the clock generator 14. The output port of the control amplifier 13 is coupled to the data output terminal 16.

The basic operation of the FM modulator circuit having the configuration described above will now be described.

In the frequency discrimination unit 1, when an FM signal is supplied to the discriminator 3 through the signal input terminal 5, the discriminator 3 outputs a positive- or negative-level voltage corresponding to a frequency shift of the FM signal in accordance with the S-shaped characteristic curve of the resonating circuit, and then supplies the voltage to the analog-to-digital converter 4. The analog-to-digital converter 4 performs digital conversion of the supplied analog voltage to output binary data, which is then sent to the signal input terminal 15 of the level determination unit 2 through the signal output terminal 6.

In the level determination unit 2, upon input of the binary data from the signal input terminal 15, the current-data register 7 retains, as current data, the binary data that is input in a period in which a latest clock signal is supplied from the clock generator 14. The one-clock-before-data register 8 retains, as one-clock-before data, the binary data which is input to the signal input terminal 15 in the immediately preceding clock period and which is transferred from the current-data register 7. The comparator 9 reads the current binary data retained in the current-data register 7 and one-clock-before binary data retained in the one-clock-beforedata register 8, and compares the levels of those two pieces of read data. If the level comparison determines that the current binary data is at a greater level than the one-clock-before data, the comparator 9 outputs "1" from the determination output port O1. If the level comparison determines that the current binary data is at a smaller level than the one-clock-before data, the comparator 9 outputs "0" from the determination output port O1. If the level comparison determines that there is a significant level difference between the current binary data and the one-clock-before binary data, i.e., if it is identified that there is a change that appears to be a level change therebetween, the comparator 9 outputs "1" to the significant-difference output port O2. On the other hand, if it cannot be determined that there is a significant difference therebetween, the comparator 9 outputs "0" from the significant-difference output port O2. The logic circuit 10 performs logic operations on the "1" or "0" output from the determination output port O1 of the comparator 9 and on the "1" or "0" output from the significant-difference output port O2, and supplies the operation result to the current-level flip-flop 11 and the control flip-flop 12.

During the time when "0" is output from the significant-difference output port O2 of the comparator 9, the current-level flip-flop 11 maintains the binary state that has been set therein, and when "1" is output from the significant-difference output port O2 of the comparator 9, the current-level flip-flop 11 receives the "1" or "0" output from the determination output port O1 of the comparator 9, so that the output state of the current-level flip-flop 11 becomes the high (H) level or the low (L) level accordingly. When the significant-difference output port O2 of the comparator 9 is "1" and the determination output port O1 of the comparator 9 is "0", "1" is supplied to the input port of the control flip-flop 12 and the control flip-flop 12 outputs the high (H) level. When the high (H) level is supplied from the control flip-flop 12 to the control amplifier 13, the output state of the current-level flip-flop 11 is sent as is to the control amplifier 13 and the high (H) level or low (L) level is supplied to the data output terminal 16. On the other hand, when the low (L) level is supplied from the control flip-flop 12 to the control amplifier 13, the output state of the current-level flip-flop 11 is prevented from being sent, so that the control amplifier 13 enters a high impedance state and the high impedance state is supplied as-is to the data output terminal 16.

FIG. 2 is a flow chart showing the major operation processes executed in the level determination unit 2 of the FM demodulator shown in FIG. 1.

The operation executed in the level determination unit 2 will now be described by referring to the flow chart.

First, in step S1, a process for initializing the level determination unit 2 is performed. That is, reset pulses are output from the reset pulse output port R of the clock generator 14 and are supplied to the current-data register 7, the one-clock-before-data register 8, the current-level flip-flop 11, and the control flip-flop 12, thereby making the output states thereof "0".

Next, in step S2, whether or not the binary data is input from the signal input terminal 15 is determined by the level determination unit 2. When it is determined that the binary data is input (Y), the process proceeds to step S3. On the other hand, when it is determined that the binary data has not been input yet, step S2 is repeated.

Thereafter, in step S3, the binary data input through the signal input terminal 15 of the level determination unit 2 is transferred to the current-data register 7 and is retained by the current-data register 7.

In step S4, the current binary data stored in the current-data register 7 and the one-clock-before binary data stored in the one-clock-before-data register 8 are read by the comparator 9 and level comparison of both pieces of read binary data is performed by the comparator 9. As the result of the level comparison, when the current binary data is determined to be greater (H) in level than the one-clock-before binary data, the process proceeds to the next step S5. On the other hand, when the current binary data is determined to be smaller (L) in level than the one-clock-before binary data, the process proceeds to step S6. When it is determined that there is no level change between the current binary data and the one-clock-before binary data, the process proceeds to step S8.

At this stage, since no binary data is stored in the one-clock-before-data register 8, the level comparison in step S4 determines that the current binary data is greater in level than the one-clock-before binary data, so that the process automatically proceeds to step S5.

Subsequently, in step S5, since both the determination output port O1 and the significant-difference output port O2 of the comparator 9 become "1", the output level of the current-level flip-flop 11 in the level determination unit 2 is set to the high (H) level.

Next, in step S9, in the level determination unit 2, the current binary data retained by the current-data register 7 is transferred to the one-clock-before-data register 8 and is retained by the one-clock-before-data register 8. After completion of this process, the process returns to step S2, and the processes subsequent to step S2 are repeated. Processes in steps S1 to S5 and step S9, which are described above, are related to the initial operation. Upon completion of the initial operation, the process proceeds to an ordinary operation for determining data.

In the ordinary operation for determining data, the operations from step S2 to step S4 are the same as the initial operations described above, and in accordance with the determination result in step S4, the process proceeds from step S4 to step S5, step S6, or step S8.

First, in step S4, when the current binary data is determined to be greater (H) than the one-clock-before binary data, the process proceeds to step S5 as described above. In step S5, the output state of the current-level flip-flop 11 is set to the high (H) level. Subsequently, the current binary data retained in the current-data register 7 is transferred to the one-clock-before-data register 8, as described below, and the binary data is retained in the one-clock-before-data register 8. After completion of the process, the process returns to step S2, and the operations subsequent to step S2 are repeated.

In step S4, when the current binary data is determined to be smaller (L) in level than the one-clock-before binary data, the process proceeds to step S6.

In step S6, in the level determination unit 2, since the output of the determination output port O1 of the comparator 9 becomes "0" and the output of the significant-difference output port becomes "1", the output state of the current-level flip-flop 11 is set to the low (L) level.

Next, in step S7, in the level determination unit 2, since the output of the determination output port O1 of the comparator 9 becomes "0" and the output port of the significant-difference output port O2 becomes "1", the output state of the control flip-flop 12 is set to the high (H) level.

Thereafter, in step S9, the current binary data stored, as described above, in the current-data register 7 is transferred to the one-clock-before-data register 8 and is retained by the one-clock-before-data register 8. Upon completion of this process, the process returns to step S2, and the operations from step S2 are repeated.

Additionally, in step S4, when it is determined that there is no level difference (0) between the current binary data and the one-clock-before binary data, the process further proceeds to step S8.

Next, in step S8, in the level determination unit 2, since the output of the significant-difference output port O2 becomes "0" regardless of the output state of the determination output port O1 of the comparator 9, the current output state of the current-level flip-flop 11 is maintained and the output state of the control flip-flop 12 is set to the low (L) level.

Thereafter, in step S9, the current binary data stored, as described above, in the current-data register 7 is transferred to the one-clock-before-data register 8, and the binary data is retained in the one-clock-before-data register 8. Upon completion of the process, the process returns to step S2, and the operation processes from step S2 are repeated.

In this manner, with the FM demodulator according to the embodiment, the output state of the control flip-flop 12 is set to the high (H) level only when the current binary data is at a different (smaller or larger) level than the one-clock-before binary data. Thus, the level determination unit 2 can perform data reproduction properly regardless of the logic state of the binary data supplied to the level determination unit 2 after the initializing operation.

While the description has been given for the case in which the frequency discrimination unit 1 includes the discriminator 3 and the analog-to-digital converter 4, the configuration of the frequency discrimination unit 1 is not limited thereto, and thus a frequency discriminator employing a pulse count method may also be used.

What is claimed is:

1. An FM demodulator to reproduce data by performing FM demodulation of a received RF signal in a Bluetooth transmission system, said FM demodulator comprising:

a frequency discrimination unit which frequency-discriminates the RF signal, which performs digital conversion of the discriminated RF signal, and which outputs converted data; and a level determination unit which performs level comparison of current input-data, supplied from said frequency discrimination unit in a latest clock period, with last input-data, supplied from said frequency discrimination unit in an immediately preceding clock period, which determines a logic state of the current input-data based on a result of the level comparison, and which reproduces data in accordance with the determined logic state.

2. An FM demodulator according to claim 1, wherein the level comparison of the current input-data with the last input-data is performed by a current-data register that retains the current input-data, a one-clock-before-data register that retains the last input-data, and by a comparator that compares output states of the two registers.

3. An FM demodulator according to claim 1, wherein the determination of the logic state of the current input-data is performed by a current-level flip-flop and an output-control flip-flop which have different output states in response to the result of the level comparison of the current input-data and the last input-data, and a controllable amplifier having an output logic value that is controlled in accordance with the output states of the two flip-flops.

* * * * *